United States Patent [19]
Mizuno et al.

[11] Patent Number: 6,070,552
[45] Date of Patent: Jun. 6, 2000

[54] SUBSTRATE PROCESSING APPARATUS

[75] Inventors: Shigeru Mizuno, Kanagawa-ken; Masahito Ishihara; Yoichiro Numasawa, both of Tokyo; Nobuyuki Takahashi, Kanagawa-ken, all of Japan

[73] Assignee: Anelva Corporation, Tokyo, Japan

[21] Appl. No.: 09/022,880

[22] Filed: Feb. 12, 1998

[30] Foreign Application Priority Data

May 27, 1997 [JP] Japan .................................. 9-152992

[51] Int. Cl.$^7$ .................................................. C23C 16/00
[52] U.S. Cl. .................................. 118/723 E; 118/723 R
[58] Field of Search ........................... 118/723 E, 723 R

[56] References Cited

U.S. PATENT DOCUMENTS 5,456,757  10/1995  Aruga et al. ..................... 118/723 E
5,589,233  12/1996  Law et al. ............................. 427/579

Primary Examiner—Christopher Raimund
Attorney, Agent, or Firm—Burns, Doane, Swecker & Mathis, LLP

[57] ABSTRACT

A substrate processing device includes a reactor equipped with a substrate holder and a gas feed electrode facing the substrate holder, a pump mechanism for pumping out an interior of the reactor, a reaction gas feed mechanism for introducing a reaction gas through the gas feed electrode into the interior of said reactor, a high frequency power source for applying a high frequency power to said gas feed electrode, a connecting port formed in a sidewall of said reactor, the pump mechanism is connected to the connecting port formed in the sidewall of the reactor, and a space between the gas feed electrode and the substrate holder is set so that a conductance between the gas feed electrode and the substrate holder is lower than a conductance between the sidewall of the reactor and the gas feed electrode.

5 Claims, 2 Drawing Sheets

SUBSTRATE PROCESSING APPARATUS

BACKGROUND OF THE INVENTION

1. Field of the Invention

The present invention relates to a substrate processing device, and in particular to a substrate processing device which is employed in the deposition of thin films using thermochemical reactions or plasma chemical reactions, or in etching applications using plasma chemical reactions.

2. Description of Related Art

More and more progress has recently been made in the miniaturization and the degree of integration of semiconductor elements in fields involving the manufacture of these elements. Many problems remain to be solved in the miniaturization of elements, such as precise miniaturization machining, sufficient film coating in microholes or at stepped portions, reducing the level difference in elements, preventing heat radiation caused by high current density, and preventing wire breakage caused by electromigration caused by high current density. Means that can be anticipated for resolving such problems include thermal CVD (chemical vapor deposition) devices with which thin films are deposited using chemical reactions, plasma CVD devices with which thin films are deposited using plasma chemical reactions, and reactive ion etching devices featuring the use of plasma chemical reactions. Here, both thermal CVD and plasma CVD devices are referred to as CVD devices for the sake of convenience. These CVD devices are described below.

The structure of the reactor in conventional CVD devices can be divided into asymmetrical and symmetrical structures, depending on the flow of gas on the substrate inside the reactor.

The basic structure of CVD devices is described with reference to FIG. 2. A substrate holder 53 equipped with an electrostatic attraction plate 52 is provided at the bottom of a reactor 51, and a shower electrode 54 is provided at the top. The shower electrode and the reactor which is maintained at ground potential are electrically insulated by an insulator 55. The substrate holder 53 is equipped with a substrate elevating and lowering device consisting of a lift pin 56, support plate 57, and vertical drive mechanism 58, as well as a heating mechanism consisting of a heater 59, a thermocouple 60, and heat control mechanism 61. The electrostatic attraction plate and substrate are heated to the desired temperature by the heating mechanism. The electrostatic attraction plate 52 is connected to an electrostatic attraction plate control power source 62, and is controlled by this power source. The electrostatic attraction plate 52 fixes the substrate 63 by electrostatic attraction force. The shower electrode 54 is connected to a reaction gas feed mechanism 64, and is electrically connected through a matching circuit 65 to a high frequency power source 66. The shower electrode 54 functions as a reaction gas feed component in the case of thermal CVD, and as a high frequency power supply port from the high frequency power source 66 in the case of plasma CVD.

In the case of thermal CVD, the temperature of the substrate 63 is stabilized to the desired temperature, a constant amount of reaction gas is fed from the shower electrode 54, and the desired thin film is deposited on the substrate on the basis of a chemical reaction.

In the case of plasma CVD, plasma is produced between the high frequency power-supplying shower electrode 54 and the substrate 63 and substrate holder 53, and the desired thin film is deposited on the substrate by a plasma enhanced chemical reaction.

During the aforementioned film deposition, film adheres to the inside surface of the reactor 51 in addition to the upper surface of the substrate 63. Removal of such film results in contaminating particles and lowers the semiconductor manufacturing yield. Films are thus usually removed by in-situ plasma cleaning every few substrate processings. During this plasma cleaning, a cleaning gas is introduced from a cleaning gas feed mechanism 74 by way of the shower electrode 54, and high frequency power is applied to the shower electrode 54 to produce a plasma inside the reactor.

When a thin film is deposited on the substrate 63 by the aforementioned CVD device, unreacted gas or byproduct gas results. The reactor 51 is equipped with a pump mechanism which actually pumps out the unreacted gas or side-reaction gas to the outside. FIG. 2 is an example in which a pump mechanism 67A is provided at the floor of the reactor 51. The pump mechanism 67A is formed of a plurality of connecting ports 75 formed in the reactor, a plurality of pipes 76 connected to the connecting ports 75, a gate valve 69, a container 70 housing the gate valve 69, a pump suction port 71, a pump 72 such as a turbo molecular pump, and an auxiliary pump mechanism 73. Other pump mechanism mounting locations include locations on the outside of the sidewalls of the reactor 51, indicated by the imaginary line 67. The pump mechanism 67A is connected to the connecting hole formed in the reactor.

The mounting locations for the pump mechanism in conventional CVD devices are described in view of the aforementioned asymmetrical and symmetrical structures.

As noted above, locations on the surrounding sidewalls (pump mechanism 67) as well as locations on the floor walls (pump mechanism 67A) can normally be considered as locations for mounting the pump mechanism on the reactor 51, depending on the design of the reactor.

In conventional structures where the pump mechanism 67 is located at the surrounding sidewall, the flow of gas on the substrate 63 is asymmetrical because the connecting hole 68 through which the gas is pumped out is partially offset. As such, this is not used except in processing devices intended for reactions in molecular flow regions of no more than $10^{-3}$ torr. When the gas flow is asymmetrical, the film uniformity or yield is adversely affected because gas flow determines the distribution of starting material gas and by-products in the reactor during film deposition by CVD. When gas flow to the substrate 63 is asymmetrical, the distribution of the film deposited on the substrate is asymmetrical according to the flow of gas. If there are parts where the circulating gas settles, deposition of reaction by-products tends to occur in these parts, causing dust and lowering the yield. Product deposition tends to result, and dust tends to be produced because of relatively greater concentrations of unreacted source gas or by-products in locations where the flow of gas from the connecting port 68 is concentrated. The structure of the reactor has accordingly been designed upon consideration of the flow of gas on the substrate in CVD devices. It is particularly important to ensure symmetrical gas flow on the substrate and to avoid gas flow with settling inside the reactor. For these reasons, it is undesirable for the structure to have the pump mechanism 67 in a location in part of the surrounding sidewall of the reactor 51.

Meanwhile, when the pump mechanism 67A is set up in the floor wall, a plurality of connecting holes 75 are generally formed equidistantly in the floor wall around the substrate holder 53, so as to allow a symmetrical gas flow to be readily created on the substrate. In this case a plurality of pipes 76 are connected to connecting ports 75. The floor wall part is generally used in the case of a viscous flow region. This has the abovementioned technical advantages and so the provision of a pump mechanism at the floor wall is preferred.

Examples of other structures for when the pump mechanism 67A is set up in the floor wall include those in which a perforated plate (indicated by broken line 77 in FIG. 2) is provided between the substrate holder 53 and the surrounding sidewalls, so that the gas flow is uniformly symmetrical. In the perforated plate 77, the number of holes or the hole diameter is designed to increase from the side on which the connecting ports are present toward the opposite wall, so as to achieve better symmetry. Even just one connecting port (or pipe connected thereto) formed around the substrate holder may be used in this case. The advantage of this structure is that the connecting port and pipe are one assembly by themselves.

The following problems come up in conventional CVD devices in which symmetrical gas flow on the substrate can be realized, that is, CVD devices in which pumping is effected from the floor wall component.

In the structure in which a plurality of connecting ports 75 are formed in the floor wall, and a plurality of pipes 76 from the outside are connected to these connecting ports, the plurality of pipes surround the drive mechanism used to convey or to elevate and lower the substrate, complicating the hardware structure of the reactor. The structure compromises the reactor maintenance, which in turn leads to lower equipment operationality.

The piping components are susceptible to concentrations of unreacted reaction gas and by-products, resulting in pronounced film adhesion. It is difficult to remove the film adhering to the piping components through plasma cleaning, making it necessary to manually clean them during maintenance. Maintenance requires the removal of the piping to clean it. Since a great deal of time is needed to remove the piping, such maintenance is even more cumbersome.

In the structure that is equipped with a perforated plate 77, film tends to adhere to or by-products tend to accumulate on the floor wall or perforated plate 77. Such film and by-products are not readily removed because it is difficult to direct the plasma to the floor wall or the inside of the holes of the perforated plate. They thus become a source of dust, which lowers the element manufacturing yield. The holes of the perforated plate cause abnormal discharge (holocathode discharge) during the deposition of films by plasma CVD or during cleaning in thermal CVD. As a result, more film adheres to the perforated plate, and the accumulated material is scattered, causing more dust.

OBJECTS AND SUMMARY

An object of the present invention is to remedy the aforementioned drawbacks by providing a substrate processing device such as a thermal CVD device or plasma CVD device, which allows symmetrical gas flow to be realized on the substrate, which has a simple structure, which allows unnecessary films adhering thereon to be removed, and which has better maintenance properties.

The substrate processing device pertaining to the present invention is constructed in the following manner to achieve the aforementioned objectives. A substrate processing device comprises a reactor equipped with a substrate holder and a gas feed electrode facing the substrate holder, a pump mechanism for pumping out an interior of the reactor, a reaction gas feed mechanism for introducing a reaction gas through the gas feed electrode into the interior of said reactor, a high frequency power source for applying a high frequency power to said gas feed electrode, a connecting port formed in a sidewall of said reactor, said pump mechanism is connected to the connecting port formed in the sidewall of the reactor, and a space between the gas feed electrode and the substrate holder is set so that a conductance between the gas feed electrode and the substrate holder is lower than a conductance between the sidewall of the reactor and the gas feed electrode, and the conductance between the gas feed electrode and the substrate holder is lower than a conductance between the sidewall of the reactor and the substrate holder.

DETAILED DESCRIPTION OF THE PREFERRED EMBODIMENTS

Figure 1:
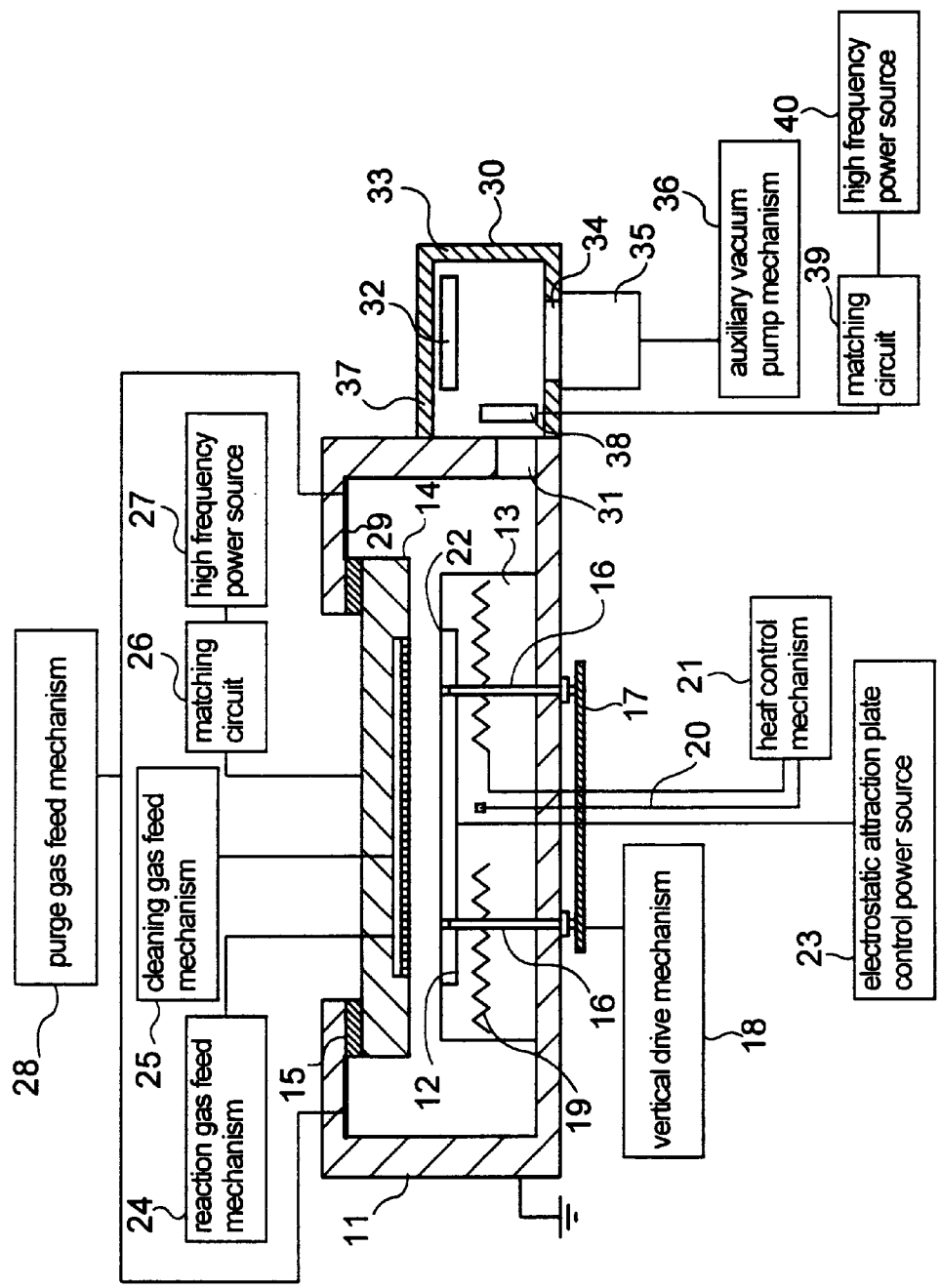
FIG. 1 is a vertical cross section of an embodiment of the substrate processing device pertaining to the present invention.
Figure 2:
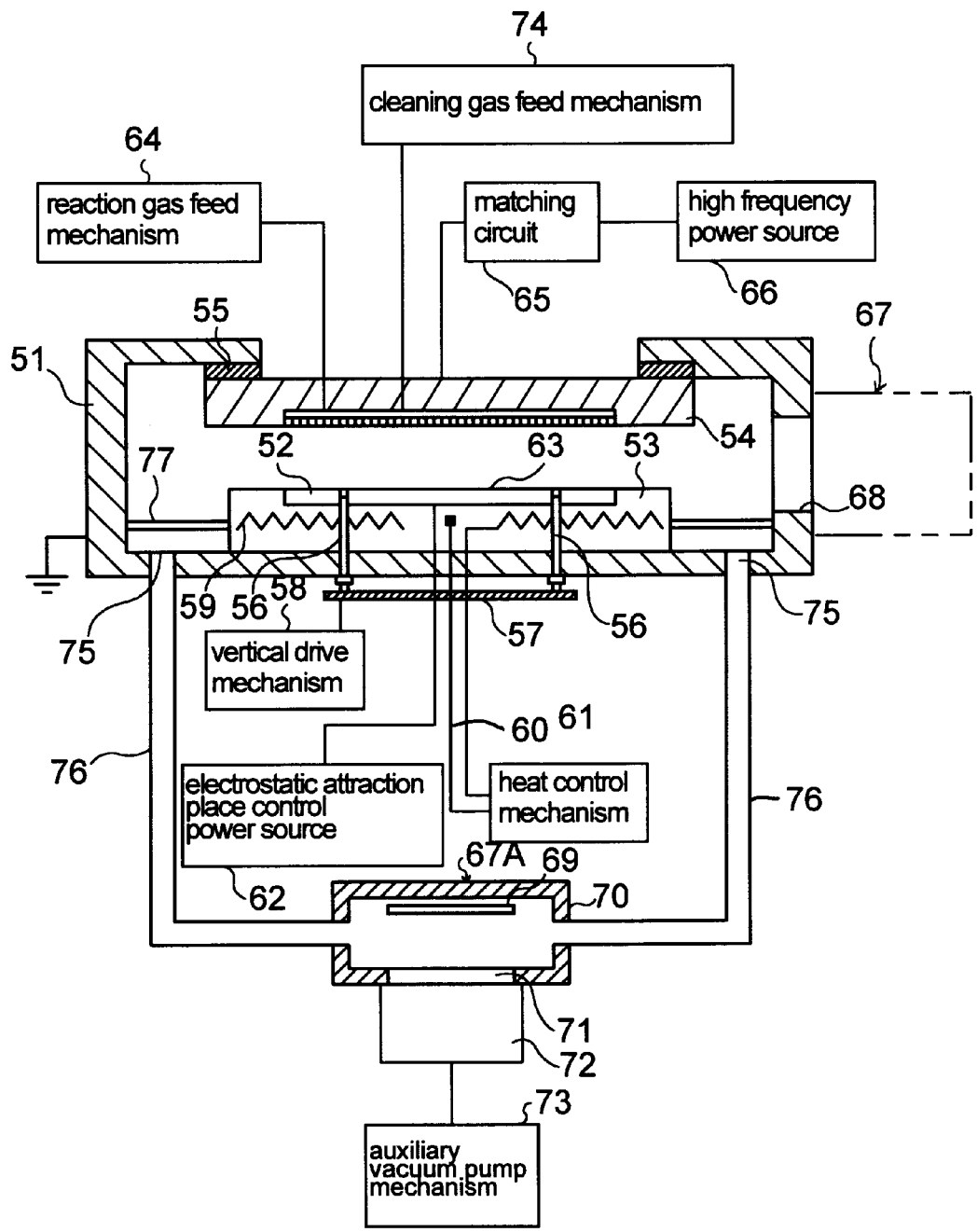
FIG. 2 is a vertical cross section of a conventional substrate processing device.

FIG. 1 depicts a typical embodiment of the present invention. An example of a CVD device (including thermal CVD and plasma CVD devices) is described for the substrate processing device in this embodiment.

In the reactor (reaction container) 11 depicted in FIG. 1, a substrate holder 13 equipped with an electrostatic attraction plate 12 is provided at the bottom, and a shower electrode 14 is provided at the top. The shower electrode 14 and the reactor 11 which is maintained at ground potential are electrically insulated by an insulator 15. The substrate holder 13 is equipped with a substrate elevating and lowering device consisting of a lift pin 16, support plate 17, and vertical drive mechanism 18, as well as a heating mechanism consisting of a heater 19, a thermocouple 20, and heat control mechanism 21. The substrate elevating and lowering device operates when a substrate 22 is placed on the upper surface of the substrate holder 13. The electrostatic attraction plate 12 and substrate 22 are heated to the desired temperature by the heating mechanism. The electrostatic attraction plate 12 is connected to an electrostatic attraction plate control power source 23. The electrostatic attraction plate control power source 23 controls the electrostatic attraction plate 12, and the electrostatic attraction plate 12 fixes the substrate 22 by electrostatic attraction force. The shower electrode 14 is joined to a reaction gas feed mechanism 24 and a cleaning gas feed mechanism 25. The shower electrode 14 is also electrically connected through a matching circuit 26 to a high frequency power source 27. The shower electrode 14 functions as a reaction gas feed component in the case of thermal CVD, and as an electrode applying high frequency power from the high frequency power source 27 in the case of plasma CVD.

A purge gas feed mechanism 28 is also attached to the reactor 11. The purge gas fed from the purge gas feed mechanism 28 is introduced through a perforated plate 29 to the annular space around the shower electrode 14 in the reactor 11.

When a thin film is formed on the substrate 22 in the aforementioned CVD device, unreacted gas or side-reaction gas results. The unreacted gas or side-reaction gas is pumped out to the outside of the reactor 11 by a pump mechanism 30.

The pump mechanism 30 is connected to a connecting port 31 formed, preferably in the form of a rectangle, in the bottom component of the sidewall surrounding the reactor 11. The pump mechanism 30 comprises a container 33 housing an opening and closing gate valve 32; a pump suction port 34 formed in the container 33; a pump 35 connected to the pump suction port 34;

and an auxiliary pump mechanism 36. The container 33 has an openable and closable structure, as indicated by the arrow 37.

A turbomolecular pump, for example, is used as the pump 35 in this embodiment. The pump mechanism 30 is provided on the side of the reactor 11, as described above. The pump mechanism 30 is attached to the side of the chamber, and the absence of piping between the connecting port 31 and the pump mechanism 30 allows high maintenance properties to be preserved. The container 33 of the pump mechanism 30 has an openable and closable structure, resulting in good operationality during maintenance.

A metal plate 38 is provided near the connecting port 31 in the container 33. The high frequency power source 40 is connected through a matching circuit 39 to the metal plate 38, and high frequency power is applied. The metal plate 38 is a cleaning electrode.

In FIG. 1, the substrate 22 conveyed by a conveyor mechanism from a conveyance port (not shown in figure) into the reactor 11 is placed by the lift pin 16 and vertical drive mechanism 18 on the electrostatic attraction plate 12 located at the top of the substrate holder 13. The electrostatic attraction plate 12 is controlled by the external electrostatic plate control power source 23, and fixes the substrate 22 through electrostatic attraction. The substrate holder 13 is kept at a constant temperature by the heat control mechanism 21, and heats the electrostatic attraction plate 12 and substrate 22.

In the case of thermal CVD, the temperature of the substrate 22 is stabilized at the desired temperature, the reaction gas is then introduced from the shower electrode 14 facing the substrate 22 into the reactor 11, and the desired thin film is formed on the substrate 22. In the case of plasma CVD, high frequency power is applied from the high frequency power supply mechanism (26, 27) to the shower electrode 14, so that plasma is produced between the shower electrode 14 and substrate 22 and substrate holder 13, and the desired thin film is deposited on the substrate 22.

In the present embodiment, the reactor 11 is preferably cylindrical. The central axis of the reactor 11, the central axis of the substrate 22, and the central axes of the substrate holder 13 and shower electrode 14 are aligned. The configuration of the reactor 11 should be axially symmetrical with respect to these central axes, but since a rectangular connecting port 31 has been provided in the side surface of the reactor 11, the present embodiment is not strictly axially symmetrical. The structure is symmetrical, however, to the plane including the central axis of the shower electrode 14 and the center of the connecting port 31.

When the discharge is stable, the reaction gas is introduced from the shower electrode 14 into the reactor 11, and the desired thin film is deposited on the substrate 22, which is kept at a constant temperature. The unreacted gas and side-reaction gas produced at this time are pumped out through the connecting port 31 by the pump mechanism 30, and the interior of the reactor 11 is thus kept at a constant pressure.

The structure of this embodiment allows a symmetrical gas flow to be formed due to the space on the top side of the substrate 22, that is, the gap between the shower electrode and substrate holder 13, even though the connecting port 31 serving as the exhaust port is formed in the sidewall around the reactor 11.

The distance between the shower electrode 14 and substrate 22 on the substrate holder 13 is sufficiently less than the distance between the shower electrode 14 and the reactor 11 surrounding sidewall. And, the distance between the shower electrode 14 and substrate 22 on the substrate holder 13 is sufficiently less than the distance between the substrate holder 13 and the reactor 11 sidewall. The conductance between the shower electrode 14 and substrate 22 on the substrate holder 13 can thus be made sufficiently lower than the conductance between the shower electrode 14 and the reactor 11 surrounding sidewall. And, the conductance between the shower electrode 14 and substrate 22 on the substrate holder 13 can thus be made sufficiently lower than the conductance between the substrate holder 13 and the reactor 11 surrounding sidewall. Even though the connecting port 31 is present in a specific radial direction with respect to the central axis of the substrate 22, the gas from the shower electrode 14 can forcibly flow in the radial direction uniformly in the direction of the circumference of the substrate.

A purge gas feed component including the perforated plate 29 is further provided at the top. A flow moving from the top toward the bottom connecting port 31 is formed by the purge gas, so that it is symmetrical with respect to the plane including the central axis of the shower electrode 14 and the center of the connecting port of the purge gas feed component. The combination of such a purge gas flow formation with the placement of the connecting port 31 between the pump mechanism 30 and reactor 11 in the chamber sidewall sufficiently below the space between the substrate holder and the shower electrode allows the gas from the shower electrode 14 to emerge in the space between the shower electrode 14 and substrate holder 13, and then move symmetrically downward. The axial symmetry of the flow on the substrate 22 is thus further enhanced.

The flow of gas from the shower electrode 14 joins the flow of purge gas from above, thus preventing the circulation from settling in the space between the shower electrode 14 and the substrate holder 13. In the device for processing a 6-inch substrate in the present embodiment, the chamber inside diameter is 400 mm, the shower electrode diameter is 250 mm, and the substrate holder diameter is 200 mm. The distance between the shower electrode 14 and the substrate 22 is 10 to 30 mm, and the distance between the shower electrode 14 and the substrate holder 13 and reactor 11 sidewall is 50 to 100 mm. The conductance between the shower electrode 14 and the substrate holder 13 and reactor 11 sidewall is sufficiently greater than the conductance between the shower electrode 14 and substrate 22 and substrate holder 13. The connecting port 31 has an opening height of 30 mm and a width of 320 mm. The top of the opening is sufficiently low at 50 mm below the position of the substrate 22.

As described above, the present embodiment is provided with a metal plate 38, that is, an auxiliary electrode that is used for cleaning. It is used to clean primarily the area around the connecting port 31 where the gas flow is concentrated and where film and by-products tend to adhere. High frequency power is applied to the metal plate 38, which is positioned as an auxiliary electrode near the connecting orifice 31 on the side of the pump mechanism 30, and plasma is produced primarily near the connecting orifice 31 separately from the plasma produced by the shower electrode 14 at the top when the chamber is cleaned. The metal plate 38 is electrically connected with the reactor 11. The lower part, to say nothing of the upper part, of the metal plate 38 are separate, except for the support component (not shown in figure) from the reactor, and the necessary exhaust conductance is maintained to allow the gas to flow. When high frequency power is applied to the metal plate 38, the plasma is produced not only in the connecting port 31 but in every direction from the metal plate 38.

The dimensions (dimensions in direction perpendicular to paper plane in figure) of the metal plate 38 are virtually the same as those of the connecting port 31. In the past, the edge of the connecting hole 31 was in the shadow when just plasma by the shower electrode was used, and no plasma landed on the port, making it difficult to clean. In contrast, the structure of the present embodiment allows not only the area near the connecting port 31 but also the interior of the pump mechanism 30 to be cleaned.

In the example described below, the present invention is used to form a tungsten film by CVD. Under the tungsten film depositing conditions, the reaction gas was 50 to 200 sccm $WF_6$, 300 to 1000 sccm $H_2$, and 0.2 to 4 sccm $SiH_4$, the substrate holder temperature was 400 to 500° C., and the film depositing pressure was 0.5 to 50 torr. Under the cleaning conditions, the cleaning gas was 110 sccm $CF_4$ and 90 sccm $O_2$, the high frequency power applied to the shower electrode 14 at the top to effect discharge is 100 to 500 W, the frequency is 13.56 MHz, the conditions under which the high frequency power is applied to the metal plate 38 serving as the auxiliary electrode is electrical power of 10 to 100 W, and the frequency is 100 KHz to 13.56 MHz. Cleaning is implemented each time a film is deposited.

The result is that the film-thickness uniformity is a favorable 5% or less even under $WF_6$ feed rate-determining conditions at which the deposition rate tends to be governed by the gas flow or concentration distribution, that is, conditions involving a low $WF_6$ flow rate or conditions involving a high film-deposition temperature. The distribution configuration was completely unaffected by the direction of exhaust, resulting in a concentric circular film-forming distribution.

The result of providing a metal plate 38 serving as an auxiliary electrode is that during cleaning in the present embodiment it is possible to remove film adhering inside the pump mechanism or around the connecting port, which has been difficult to achieve in the past with plasma from the shower electrode 14. This allows maintenance time to be drastically curtailed and maintenance cycles to be made 1.5 times longer than in the past.

CVD devices such as thermal CVD and plasma CVD devices were described in the aforementioned embodiment, but the structure pertaining to the present invention can also generally be employed for other substrate processing devices where the gas flow during the substrate processing is of importance, such as in reactive ion etching devices featuring the use of chemical reaction and plasma.

As described above, the present invention allows symmetrical gas flow to be obtained on substrates, even when the connecting port used to set up a pump mechanism is provided in the chamber sidewall of the reactor of a CVD device. Providing the connecting port in the chamber sidewall allows the structure to be simplified, and allows good maintenance to be preserved. A cleaning electrode can be set up with a simple structure in the connecting port, and the connecting port and pump mechanism can be readily cleaned with plasma.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A substrate processing device comprising:
    a reactor equipped with a substrate holder and a gas feed electrode facing the substrate holder,
    a pump mechanism for pumping out an interior of the reactor,
    a reaction gas feed mechanism for introducing a reaction gas through the gas feed electrode into the interior of said reactor,
    a high frequency power source for applying a high frequency power to said gas feed electrode,
    a sidewall of the reactor, the sidewall having a first end adjacent the reaction gas feed mechanism and a second end opposite the first end,
    a connecting port formed in the sidewall of said reactor, the connecting port being located at the second end of the sidewall where the connecting port is as far as possible from the gas feed electrode,
    said pump mechanism is connected to the connecting port formed in the sidewall of the reactor, and a space between the gas feed electrode and the substrate holder is set so that a conductance between the gas feed electrode and the substrate holder is lower than a conductance between the sidewall of the reactor and the gas feed electrode, and the conductance between the gas feed electrode and the substrate holder is lower than a conductance between the sidewall of the reactor and the substrate holder.

2. The substrate processing device comprising:
    a reactor equipped with a substrate holder and a gas feed electrode facing the substrate holder,
    a pump mechanism for pumping out an interior of the reactor,
    a reaction gas feed mechanism for introducing a reaction gas through the gas feed electrode into the interior of said reactor,
    a high frequency power source for applying a high frequency power to said gas feed electrode,
    a connecting port formed in a sidewall of said reactor,
    said pump mechanism is connected to the connecting port formed in the sidewall of the reactor, and a space between the gas feed electrode and the substrate holder is set so that a conductance between the gas feed electrode and the substrate holder is lower than a conductance between the sidewall of the reactor and the gas feed electrode, and the conductance between the gas feed electrode and the substrate holder is lower than a conductance between the sidewall of the reactor and the substrate holder,
    wherein the connecting port is formed in a location underneath the space between the gas feed electrode and the substrate holder, a purge gas feed mechanism is provided to introduce a purge gas into a space around the gas feed electrode, the flow of the purge gas is symmetrical to the plane including a central axis of the gas feed electrode and a center of the connecting port for the purge gas feed mechanism, and the flow of the reaction gas and the flow of the purge gas flow together, so that the flow of the reaction gas is axially symmetrical to the central axis of the gas feed electrode.

3. The substrate processing device as defined in claim 1, wherein the pump mechanism comprises a container which is attached to the connecting port and which is equipped with a suction port; a pump which is connected to the suction port; and a valve which is housed in the container and which opens and closes the suction port.

4. The substrate processing device comprising:

a reactor equipped with a substrate holder and a gas feed electrode facing the substrate holder, a pump mechanism for pumping out an interior of the reactor, a reaction gas feed mechanism for introducing a reaction gas through the gas feed electrode into the interior of said reactor, a high frequency power source for applying a high frequency power to said gas feed electrode, a connecting port formed in a sidewall of said reactor, said pump mechanism is connected to the connecting port formed in the sidewall of the reactor, and a space between the gas feed electrode and the substrate holder is set so that a conductance between the gas feed electrode and the substrate holder is lower than a conductance between the sidewall of the reactor and the gas feed electrode, and the conductance between the gas feed electrode and the substrate holder is lower than a conductance between the sidewall of the reactor and the substrate holder, wherein the pump mechanism comprises a container which is attached to the connecting port and which is equipped with a suction port; a pump which is connected to the suction port; and a valve which is housed in the container and which opens and closes the suction port, and further comprising a metal member disposed near the connecting port inside the pump mechanism, a high frequency power source provided for applying high frequency power to the metal member, and the high frequency power is applied to the metal member during cleaning.

5. The substrate processing device as defined in claim 3, wherein the container has an opening and closing component.

* * * * *